252-146. AU 165 EX
07-11-72 XR 3,676,219

United States Patent Office 3,676,219
Patented July 11, 1972

3,676,219

CHEMICAL STRIPPERS AND METHOD OF USING

Kenneth H. Schroeder, Wilmington, Del., and George J. Kelly, Jr., Port Murray, N.J., assignors to Allied Chemical Corporation, New York, N.Y.

No Drawing. Continuation-in-part of application Ser. No. 866,036, Oct. 13, 1969. This application Sept. 25, 1970, Ser. No. 75,660
Int. Cl. C23g *1/02*
U.S. Cl. 134—3 3 Claims

ABSTRACT OF THE DISCLOSURE

Strippers for removal of organic films and deposits, such as the polymeric etch resists employed in the manufacture of semiconductors from silicon bodies or silicon dioxide coated silicon bodies, are composed of solutions of chromium trioxide in mixtures of strong nitric and sulfuric acids containing about 2% to about 20% water.

This application is a continuation-in-part of application Ser. No. 866,036 filed Oct. 13, 1969, now abandoned.

BACKGROUND

In the chemical arts the removal of organic deposits, layers or films from silicon and silicon dioxide surfaces has been a much considered problem. While various chromium-containing acidic mixtures have been employed, there has remained room for improvement in effectiveness both as to speed and temperature of removal. While cleaning of industrial and laboratory glassware may be cited as one field of utility for such compositions, there has in recent years developed a more challenging utility in the manufacture of semiconductors for electronic purposes. In the manufacture of semiconductors, it is common practice in certain operations to develop desired circuit geometries or patterns onto the silicon body or a silicon dioxide layer thereon during the many processing steps. These geometries are commonly etched into the silicon body or the silicon dioxide layer by selective etching using an etch resist patterned to the desired geometry. This is commonly done by coating the semiconductor with a polymric photoresist (of either the positive or negative acting types that are exposed through a pattern mask to visible or ultraviolet light or other energy source such as an electron beam). The exposed portion of the photoresist film in the case of positive acting resists, or the unexposed portion of the photoresist film in the case of negative acting resists, is dissolved and removed by a developer solvent. The residual photoresist film is usually dried and baked, leaving the desired pattern of polymeric etch resist that will not be attacked by the chemicals doing the desired etching or other operation on the semiconductor surfaces not protected by the polymeric resist. After the desired operation is performed, it becomes necessary to remove the remaining polymeric etch resist. Sulfuric acid and sulfuric acid solutions or slurries containing chromic acid have been found effective at 90°–100° C. or higher temperatures in removing this residual polymeric resist. Various organic solutions containing solvents and phenolic materials are also effective strippers when used at 90°–100° C. or above.

DESCRIPTION OF THE INVENTION

The subject of this invention is a group of solutions and their use. The solutions are suitable for the above-described stripping operation. The stripping solutions of the invention do not cause etching, peeling or other visible degradation of silicon bodies or silicon dioxide film on silicon bodies even after five or ten cycles of coating and removal of etch resist, and do not affect the electrical resistivity of the silicon bodies. The solutions also are effective for removal of other polymeric and like organic deposits from inorganic surfaces such as silica, glass and the like and from organic surfaces such as polyethylene, polytetrafluoroethylene and acrylonitrile-butadiene-styrene terpolymers. The solutions of the invention comprise sulfuric acid, sufficient nitric acid (0.5% to 80% $HNO_3$) to substantially increase the solubility of chromium trioxide ($CrO_3$), from 0.3% of $CrO_3$ up to its saturation concentration in the solution at 30° C. The $H_2SO_4$ and $HNO_3$ together constitute at least 75% of the solution, and the proportion of water present may vary from about 2% to about 20%, preferably from about 2% to about 16%. Substantially larger proportions of water result in substantially lower stripping efficiency.

The stripping capacity of the solutions of the invention increases as the $CrO_3$ content increases, and the preferred solutions are those containing relatively high proportions of the $CrO_3$. The solutions of the invention containing more than 2% $CrO_3$ have a distinct advantage in this respect, compared to prior art stripping solutions of sulfuric acid and $CrO_3$. However, even with solutions of the invention containing less than 2% of the $CrO_3$, effective stripping is obtained at room temperature (10°–40° C.) of coatings that could be effectively stripped by prior art stripping agents only at temperatures of 90°–100° C. or above.

$CrO_3$ may be supplied to the subject systems in any convenient form. One convenient form is sold in commerce in crystalline state as the anhydride of chromium acid. $CrO_3$ may also be conveniently supplied to the systems in the form of salts. Illustrative are the chromate salts, such as $Na_2CrO_4 \cdot 10H_2O$, $K_2CrO_4$ and $(NH_4)_2CrO_4$, and the dichromate salts such as $Na_2Cr_2O_7 \cdot 2H_2O$, $K_2Cr_2O_7$ and $(NH_4)_2Cr_2O_7$.

$CrO_3$ solubility peaks at equivalent sulfuric acid concentrations of about 85%, and our preferred compositions of high $CrO_3$ content have an equivalent sulfuric acid concentration of at least 75%, or an $HNO_3$ content of at least 40% and an equivalent sulfuric acid concentration of at least 67%. Equivalent sulfuric acid concentration equals $$\%H_2SO_4 \times 100/(\%H_2SO_4 + \%H_2O)$$

The compositions of the invention may contain minor quantities of other ingredients so long as they do not interfere with the intended use. Fluorine, chlorine, alkali metals or alkaline earth metals, borates, phosphates or other materials which might affect the silicon bodies or silicon dioxide film must not be present in active concentrations. Depending on the application and upon the specific concentration of $CrO_3$ in the stripping solutions of the invention, alkali metals or other cations introduced in the form of salts may be tolerated if not present in an active concentration. The determination of the concentration at which a given cation or cations are active may be readily determined by routine experimentation. Thus, in a given application, for reasons of economy or convenience it may be desirable to use a sodium salt of chromic acid up to the point of tolerance. Any make-up $CrO_3$ that may be required could then be added in the form of the acid anhydride or a salt in which the cation is not objectionable such as, for example, the ammonium salt. Hydrogen ($H^+$) is not, of course, an objectionable cation. For some purposes, it is preferred to have the solutions substantially completely free of cations such as $Na^+$, $K^+$ and $NH_4^+$ in which case the $CrO_3$ is provided in a form other than a salt. By substantially completely free, it is intended to include only trace amounts of cation impurities which may be introduced with the $H_2SO_4$ and $HNO_3$ components, for example, in the order of 10 p.p.m. and less.

It is to be understood that the weight percent of $CrO_3$ referred to in the specification and claims refers to the $CrO_3$ radical and not the compound which is the source of the chromate ions. Thus, one part of dichromate salt having two chromium atoms has a higher $CrO_3$ equivalency than one part of a chromate salt having only one chromium atom.

In the manufacture of semiconductors from silicon dioxide-coated silicon bodies, metallic aluminum films are frequently associated with the silicon dioxide films under such circumstances that strippers harmless to the aluminum must be used. See, for example, U.S. Pat. 3,426,422. As regards corrosiveness to aluminum, the strippers of the invention have been found to be the equal of or superior to prior art strippers used for such purposes, when applied at appropriate stripping temperatures.

No particular procedure is required for the manufacture of the solutions of the present invention. Water and then sulfuric acid may be added to nitric acid with agitation and cooling, and then the $CrO_3$ may be added with additional agitation and cooling. A part or all of the water may be present as a constituent of one or both of the acids used, or a nitric acid containing more than the desired amount of water may be employed and oleum used to replace all or part of the sulfuric acid.

The solutions may be employed in conventional manner for removing the coatings, deposits, etc. Thus the article to be cleaned may be washed by immersion, by a flowing stream or stirred body of the solution or by a spray directed against the article. The solutions have the important advantage that they are not only effective at ordinary room temperatures, but they are also effective at elevated temperatures and may be used at such temperatures with attendant increased rate or cleaning. Thus their use at temperatures of 100° C. or so provides exceedingly rapid removal of etch resists such as Kodak Metal Etch Resist, usually designated "KMER," a product of Eastman Kodak Company.

In the following examples illustrative embodiments of the invention are prepared and tested. Example 1 illustrates the preparation of the solutions.

EXAMPLE 1

Into a round bottom glass flask fitted with cooling bath, agitator, thermometer, and drying tube, were added 709 parts of 70.54% nitric acid. Then 792 parts of distilled water and 849 parts of 95.56% sulfuric acid were added serially and progressively with agitation and cooling. The temperature was maintained at 20°–30° C. After addition of sulfuric acid was completed to form the solvent, the temperature was lowered to 0°–5° C., at which $CrO_3$ is more soluble therein; and to 1000 parts of the solvent 68.5 parts of $CrO_3$ (as crystals of chromic acid anhydride) were added. Parts are by weight.

In order to evaluate the solutions of the invention for use in the manufacture of semiconductors, the following test procedure was employed. Silicon wafers, commercially coated with a silicon dioxide film according to practices regularly employed in the semiconductor industry (8000 angstrom steam-grown films), were employed as test specimens. An etch resist solution sold commercially for this purpose was applied to the film uniformly by the technique known as spin casting. The composition used is a xylene solution of a prepolymer of the polyisoprene type and a sensitizer or developer for promoting hardening and insolubilizing. It is sold by the Eastman Kodak Company under the trade designation "KMER." The prepolymer is susceptible to curing by exposure to light rays in or near the visible-ultraviolet border; wave lengths of about 315 to 480 millimicrons and especially near the middle of this range; it is thus converted to a protective coating insoluble in xylene. The coated wafers were heated to a temperature of about 100° C. for about 30 minutes to evaporate off the solvent. They were then masked with an opaque stencil to shield portions of the coating and were exposed to light rays from a 600 watt Westinghouse "Oxy Movie Flood" lamp at a distance of about 9 inches for about one-half minute to harden the coating and render it insoluble. The wafers were then immersed in and washed with KMER solvent (xylene) to remove the uncured portions of the coating. The wafers were then baked at 160° C. (or at 200° C. where so indicated) for 30 minutes to further harden the polymer. Each wafer now possessed on one surface a silicone dioxide film which was partially exposed and partially protected by cured organic polymer.

To test the stripping action of the various stripping solutions, a wafer was immersed in the stripping solution under test at 27°–28° C., except as otherwise indicated, and for the time indicated in the following table. The wafer was then washed by dipping it in water, then subjecting it to a stream of distilled water. The washed wafer was examined visually and microscopically (at 20×) to determine extent of removal of the polymer and condition of the silicon dioxide wafer.

TABLE

| Example | Equivalent $H_2SO_4$, percent | Concentration as percent of solvent | | | | Minutes for stripping[1] |
|---|---|---|---|---|---|---|
| | | $H_2SO_4$ | $HNO_3$ | $H_2O$ | $CrO_3$ | |
| 1 | 85.5 | 81.2 | 5.0 | 13.8 | 6.85 | 0.5 to 1.0. |
| 2[2] | 94.1 | 57.7 | 38.7 | 3.6 | 3.1 | 1.5–. |
| 3 | 73.5 | 44.1 | 40.0 | 15.9 | 0.93 | 1.5 to 4.0. |
| 4 | 73.5 | 44.1 | 40.0 | 15.9 | 0.5 | 1.5 to 4.0. |
| 5 | 79.5 | 47.7 | 40.0 | 12.3 | 3.33 | 1.0+; 1.5–. |
| 6[2] | 94.3 | 84.0 | 10.8 | 5.2 | 2.04 | 1.5–. |
| 7 | 85.5 | 84.6 | 1.0 | 14.4 | 6.42 | 1.5+; 4.0–. |
| 8 | 85.5 | 84.6 | 1.0 | 14.4 | 6.42 | 0.08.[3] |
| 9 | 85.5 | 84.6 | 1.0 | 14.4 | 0.5 | 1.5 to 4.0. |
| 10 | 94.5 | 93.6 | 1.0 | 5.4 | 2.22 | 1.5+; 4.0–. |
| 11 | 71.5 | 20.0 | 72.0 | 8.0 | 2.83 | 1.5–. |
| 12 | 97.5 | 87.75 | 10.0 | 2.25 | 4.32 | 0.5. |
| 13 | 97.5 | 96.5 | 1.0 | 2.5 | 0.46 | 1.5–. |
| 14 | 85.5 | 85.1 | 0.5 | 14.4 | 5.61 | 1.5–. |
| 15 | 94.5 | 56.7 | 40.0 | 3.3 | 9.25 | 1.5–. |
| 16 | 79.5 | 71.5 | 10.0 | 18.5 | 1.86 | 4.0 to 10. |

[1] The minus signs in this column indicate complete removal in less than the indicated time; the plus signs signify that all but a trace was removed in the indicated time.

[2] Coating postbaked at 200° C. for 30 minutes.

[3] Test at the usual 90°–100° C. stripping temperature.

No etching, peeling or other visible degradation of the silicon wafers was observed. Further, the electrical resistivity of the wafers remains unaffected.

Compositions numbered 1, 6, 7, 10, 12 and 14, which contain at least 80% $H_2SO_4$, at least 2% $CrO_3$, at least 2% water, and at least 0.5% but not over 14% $HNO_3$, possess a valuable combination of properties rendering them especially satisfactory stripping agents in semiconductor manufacture. They possess rapid stripping action, high stripping capacity, excellent freedom from fuming, and particularly low corrosiveness to aluminum metal.

Prior to the present invention compositions containing nitric, chromic and sulfuric acids have been disclosed for such purposes as metal finishing but these compositions differ fundamentally from those of the present invention in containing much higher water contents and, in general, an essential ingredient increasing the activity of the composition. Such compositions are disclosed in U.S. Pats. 2,172,171, 2,497,905, 2,904,414 and 3,060,071 showing hydrochloric acid, phosphoric acid, boric acid or hydrofluoric acid as essential constituents. The compositions of these patents are wholly unsuitable for the purposes of the present invention.

All numerically expressed proportions herein set forth are by weight based on total solution unless otherwise indicated.

It is to be understood that the specific details recited in the specification are set forth by way of illustration and not by way of limitation of the invention. For example, as will be obvious to anyone of ordinary skill in this art, various additives may be added to the stripping solutions of the invention without altering the basic properties and characteristics of the stripping solutions. Illustrative are thickeners such as colloidal silica. Hence the scope of the invention is to be limited only by a reasonable interpretation of the following claims.

We claim:

1. A method for removing organic deposits from silicon and silicon dioxide surfaces, comprising stripping said deposits from said surfaces with a stripping solution comprising water, chromium trioxide, sulfuric acid and nitric acid, said solution including at least 2% by weight of solution of chromium trioxide, at least 2% water, an $H_2SO_4$ content of at least 80% and an $HNO_3$ content of at least 0.5% and not over 14% and washing said solution containing dissolved deposits from said surfaces.

2. The method of claim 1 wherein said stripping solution is substantially free of cations other than hydrogen.

3. The method of claim 2 wherein said washing is effected at 10°–40° C.

References Cited

UNITED STATES PATENTS

| | | | |
|---|---|---|---|
| 2,127,469 | 8/1938 | Hempel | 252—101 X |
| 2,837,484 | 6/1958 | Swa et al. | 134—3 X |
| 3,520,683 | 7/1970 | Kerwin | 96—36.2 |
| 3,523,825 | 8/1970 | Callahan et al. | 134—3 X |
| 3,423,262 | 1/1969 | Barditch et al. | 156—13 |

MAYER WEINBLATT, Primary Examiner

U.S. Cl. X.R.

96—36, 36.2; 117—34; 156—13; 252—79.2, 142, 146